United States Patent
Kurusu

(10) Patent No.: US 6,624,512 B2
(45) Date of Patent: Sep. 23, 2003

(54) SEMICONDUCTOR INTEGRATED CIRCUIT DEVICE AND PRINTED WIRED BOARD FOR MOUNTING THE SAME

(75) Inventor: Hitoshi Kurusu, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/157,981

(22) Filed: May 31, 2002

(65) Prior Publication Data

US 2003/0111727 A1 Jun. 19, 2003

(30) Foreign Application Priority Data

Dec. 18, 2001 (JP) ......................................... 2001-384255

(51) Int. Cl.$^7$ ............................................. H01L 23/48
(52) U.S. Cl. ...................... 257/737; 257/778; 257/783; 257/730
(58) Field of Search ................................ 257/737, 738, 257/778, 730; 228/180.22; 438/613

(56) References Cited

U.S. PATENT DOCUMENTS

| | | | | |
|---|---|---|---|---|
| 4,764,804 A | * | 8/1988 | Sahara et al. ................. 257/737 |
| 5,203,075 A | * | 4/1993 | Angulas et al. ................ 29/840 |
| 5,214,308 A | * | 5/1993 | Nishiguchi et al. .......... 257/692 |
| 5,219,117 A | * | 6/1993 | Lin ............................... 228/253 |
| 5,348,214 A | * | 9/1994 | Nishiguchi et al. ..... 228/180.22 |
| 5,403,776 A | * | 4/1995 | Tsuji et al. .................... 257/738 |
| 5,409,157 A | * | 4/1995 | Nagesh et al. .......... 228/180.22 |
| 5,523,628 A | * | 6/1996 | Williams et al. ............. 257/777 |
| 5,829,668 A | * | 11/1998 | George et al. ................ 228/254 |
| 5,864,178 A | * | 1/1999 | Yamada et al. .............. 257/737 |
| 5,926,694 A | * | 7/1999 | Chigawa et al. ............. 438/106 |
| 6,180,261 B1 | * | 1/2001 | Inoue et al. .................. 428/626 |
| 6,376,915 B1 | * | 4/2002 | Hikita et al. ................. 257/777 |
| 6,437,451 B2 | * | 8/2002 | Farnworth et al. ........... 257/780 |

FOREIGN PATENT DOCUMENTS

| | | | | |
|---|---|---|---|---|
| JP | 6-268016 | | 9/1994 | |
| JP | 7-211745 | | 8/1995 | |
| JP | 2000-252413 | * | 2/1999 | ......... H01L/25/065 |
| JP | 2000-91380 | | 3/2000 | |

\* cited by examiner

*Primary Examiner*—Jasmine Clark
(74) *Attorney, Agent, or Firm*—Leydig, Voit & Mayer, Ltd.

(57) ABSTRACT

A semiconductor integrated circuit device and a printed wired board which self-align to each other in an exact and precise manner. The semiconductor integrated circuit device has conductive bumps. The printed wired board has conductive recessed members at positions corresponding to the conductive bumps. Each of the conductive bumps is fitted into the corresponding conductive recessed member so that the printed wired board is aligned with the semiconductor integrated circuit device.

10 Claims, 13 Drawing Sheets

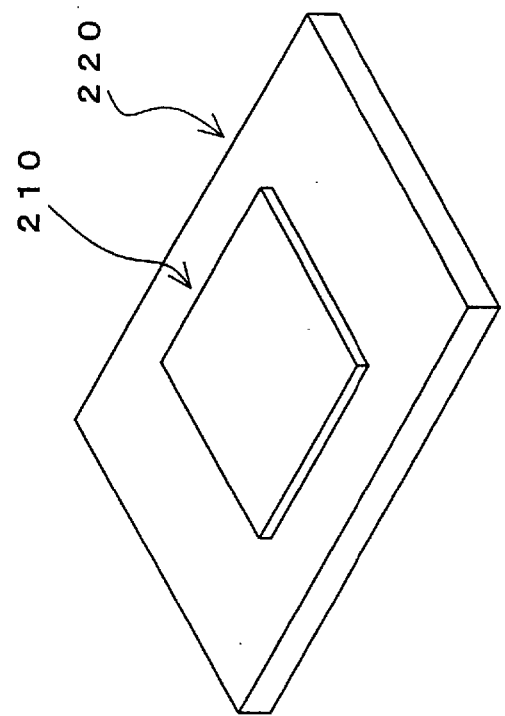
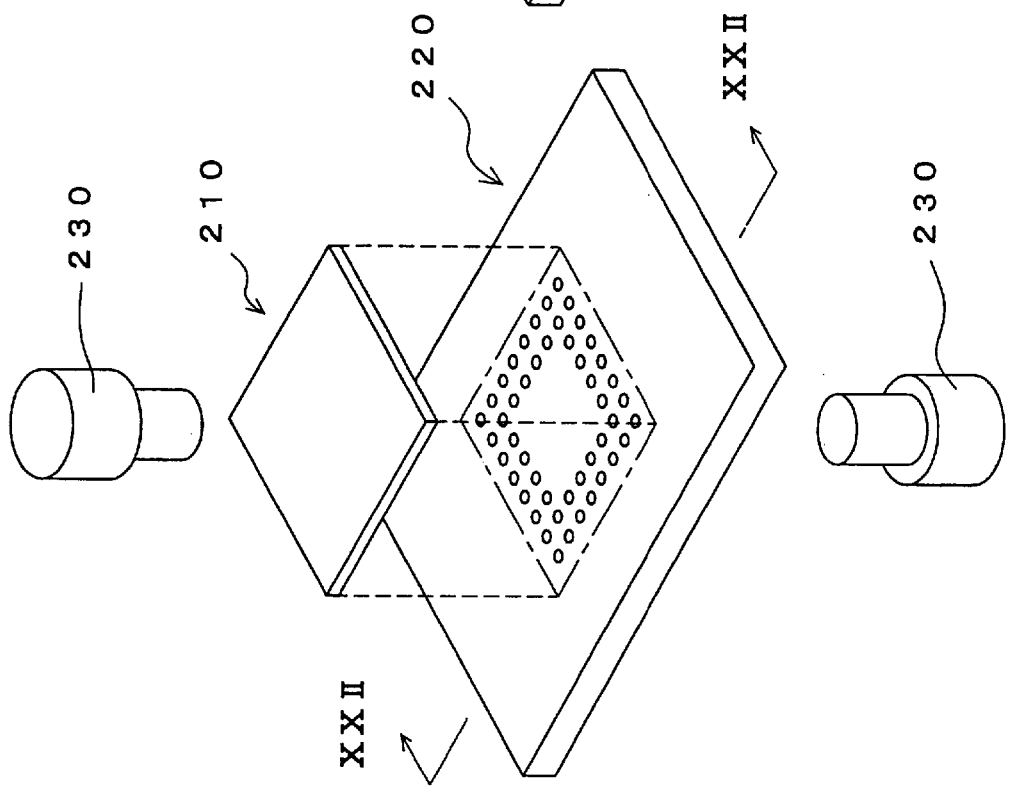
Fig. 21A PRIOR ART
Fig. 21B PRIOR ART

SEMICONDUCTOR INTEGRATED CIRCUIT DEVICE AND PRINTED WIRED BOARD FOR MOUNTING THE SAME

CROSS-REFERENCE TO RELATED APPLICATIONS

A related patent application is a commonly assigned Japanese Patent Application No. 2001-384255 filed on Dec. 18, 2001, which is incorporated by reference into the present patent application.

BACKGROUND OF THE INVENTION

1) Technical Field of the Invention

The present invention relates to a semiconductor integrated circuit device and a printed wired board for mounting the device.

2) Description of Related Arts

Recently developed hand-held electronic devices including cellular phones and mobile computers have been improved in various functions and have been reduced in their sizes. Still demands for improvement of capacity, speed, and functions of the semiconductor integrated circuit devices (referred to simply as an "IC device"), as well as demand for reduction of the package of the IC device have increased. In particular, to address the demand for reduction of the size of the package, flip-chip mounting (bonding) is commonly used, in which IC devices with a so-called BGA (Ball Grid Array) structure are flipped to oppose a printed wired board mounted thereon.

Referring to FIGS. 21A, 21B, 22A, and 22B, a conventional IC device and a printed wired board will be described. The IC device 210 is an MMIC chip (Microwave Monolithic Integrated Circuit) made of material such as silicon (Si) and gallium arsenide (GaAs), which has a downward faced surface 211 and an upward faced surface 212. Also, a plurality of bumps 213 of material such as solder are located on the chip surface 211. The printed wired board 220 has a substrate 221 made of a material such as glass-epoxy resin, and a plurality of substrate electrodes 224 formed by gold plating on the board surface 222.

As illustrated in FIGS. 21A and 22A, the IC device 210 so constructed is flipped and disposed over the printed wired board 220 so that the chip surface 211 opposes the board surface 222. In order to achieve a good electrical connection between each solder bump 213 and the corresponding substrate electrode 224, the IC device 210 must be disposed over the printed wired board 220 in a extremely strict and precise manner i.e., with an alignment accuracy much smaller than the diameter of the solder bump 213. The IC device 210 are precisely aligned to the printed wired board 220, and then heated for mounting (flip-chip bonding), as illustrated in FIGS. 21B and 22B.

According to the prior art shown in FIG. 21A, an alignment control system uses two sensitive cameras 230 for independently reading image data of the IC device 210 and the printed wired board 220, respectively, and controls relative translation therebetween based upon the image data so as to align them with each other. Thus, the conventional alignment control system of the flip-chip bonding process requires two sensitive cameras 230 for the alignment of the IC device 210 and the printed wired board 220 with much less precision than the diameter of the solder bump 213.

However, such an alignment control system with the use of two sensitive cameras 230, which is an expensive and complicated system, raises the cost of the flip-chip bonding process and requires a substantial time to control relative translation between the IC device 210 and the printed wired board 220. Consequently, the manufacturing cost of the resultant device is rather high.

SUMMARY OF THE INVENTION

The object of the present invention is to provide a semiconductor integrated circuit device and a printed wired board, which can self-align to each other in an exact and precise manner, even where the semiconductor integrated circuit device and the printed wired board are positioned to each other with the alignment accuracy as the diameter of the solder bump.

The printed wired board according to the first aspect of the present invention, which mounts a semiconductor integrated circuit device having a plurality of conductive bumps thereon. The printed wired board includes a plurality of conductive recessed members at positions corresponding to those of the conductive bumps. Each of the conductive bumps is fit into the corresponding conductive recessed member so that the printed wired board is aligned to the semiconductor integrated circuit device. Therefore, each of the conductive recessed members self-aligns the corresponding conductive bump so as to eliminate the necessity of the precise alignment. In other words, even where the semiconductor integrated circuit device is arranged on the printed wired board without a severe accuracy, each conductive bump can be guided in a stable and proper position on the corresponding conductive recessed member.

The semiconductor integrated circuit device according to the second aspect of the present invention, which is mounted on a printed wired board having a plurality of conductive bumps thereon. The semiconductor integrated circuit device includes a plurality of conductive recessed members at positions corresponding to those of the conductive bumps. Each of the conductive bumps is fit into the corresponding conductive recessed member so that the semiconductor integrated circuit device is aligned to the printed wired board. Therefore, each of the conductive recessed members self-aligns the corresponding conductive bump so as to eliminate the necessity of the precise alignment. In other words, even where the semiconductor integrated circuit device is arranged on the printed wired board without severe accuracy, each conductive bump can be guided in a stable and proper position on the corresponding conductive recessed member.

The semiconductor integrated circuit device according to the present invention, further includes a circuit surface opposing to the printed wired board and a circuit flip-surface and a wire pattern formed on the circuit flip-surface. The wire pattern electrically contacts one of the conductive bumps. Therefore, the biasing wire pattern with large current capacity can be obtained without enlarging the package of the semiconductor integrated circuit device.

The printed wired board according to the third aspect of the present invention, which mounts a semiconductor integrated circuit device of a predetermined planar configuration having a plurality of conductive bumps thereon. The printed wired board includes a bottom surface and a peripheral wall surface together defining a receiving depression having the predetermined planar configuration which is substantially identical to that of the semiconductor integrated circuit device. The printed wired board also includes a plurality of substrate electrodes formed on the bottom surface. The semiconductor integrated circuit device is received into the receiving depression so that each of the conductive bumps is aligned to the corresponding substrate electrode. Thus, when the semiconductor integrated circuit device is flip-chip mounted on the printed wired board, the peripheral wall surface can be used as an alignment restraint to guide the semiconductor integrated circuit device along the peripheral wall surface into the receiving depression. Therefore, the semiconductor integrated circuit device is aligned with the printed wired board in a precise manner.

In the printed wired board according to the present invention, the peripheral wall surface of the receiving depression is inclined outwardly. This facilitates the semiconductor integrated circuit device to be inserted into the receiving depression.

The printed wired board according to the fourth aspect of the present invention, which have a plurality of conductive bumps thereon. The printed wired board includes a plurality of substrate electrodes and a plurality of bosses made of hard metal. Each boss has a side surface. The side surfaces of the plurality of bosses contact a peripheral portion of the semiconductor integrated circuit device so that each of the conductive bumps is aligned to the corresponding substrate electrode. Thus, the bosses made of hard metal can be used as alignment restraints to align each of the conductive bumps to the corresponding substrate electrode 85 in a precise manner.

In the printed wired board according to the present invention, each of the side surfaces of the bosses is inclined outwardly. This facilitates the semiconductor integrated circuit device to be inserted into the receiving depression.

The printed wired board according to the fifth aspect of the present invention, which mount a semiconductor integrated circuit device having a plurality of recesses formed on a circuit surface. The printed wired board includes a plurality of bosses made of hard metal. Each of the bosses is fit into the corresponding recess so that the printed wired board is aligned to the semiconductor integrated circuit device. To this end, when each of the bosses formed of hard metal is received in the corresponding recess of the semiconductor integrated circuit device, the bosses are used as alignment restraints to align each of the conductive bumps to the corresponding recesses.

The semiconductor integrated circuit device according to the sixth aspect of the present invention, which is mounted on a printed wired board having a plurality of recesses formed on a board surface. The semiconductor integrated circuit device includes a plurality of bosses made of hard metal. Each of the bosses is fit into the corresponding recess so that the semiconductor integrated circuit device is aligned to the printed wired board. To this end, when each of the bosses formed of hard metal is received in the corresponding recess of the printed wired board, the bosses are used as alignment restraints to align each of the conductive bumps to the corresponding recesses.

Further scope of applicability of the present invention will become apparent from the detailed description given hereinafter. However it should be understood that the detailed description and specific examples, while indicating preferred embodiments of the invention, are given by way of illustration only, since various changes and modifications within the sprit and scope of the invention will become apparent to those skilled in the art from this detailed description.

BRIEF DESCRIPTION OF THE DRAWINGS

The present invention will more fully be understood from the detailed description given hereinafter and accompanying drawings which are given by way of illustration only, and thus are not limitative of the present invention and wherein.

FIGS. 21A and 21B are perspective views of a printed wired board and a semiconductor integrated circuit device to be mounted thereon according to the prior art.

DETAILED DESCRIPTION OF THE PREFERRED EMBODIMENTS

Referring to the attached drawings, the details of embodiments according to the present invention will be described hereinafter. In those descriptions, although the terminology indicating the directions (for example, "upwardly", and "downwardly") are conveniently used just for clear understandings, it should not be interpreted that those terminology limit the scope of the present invention.

Embodiment 1.

Figure 1:
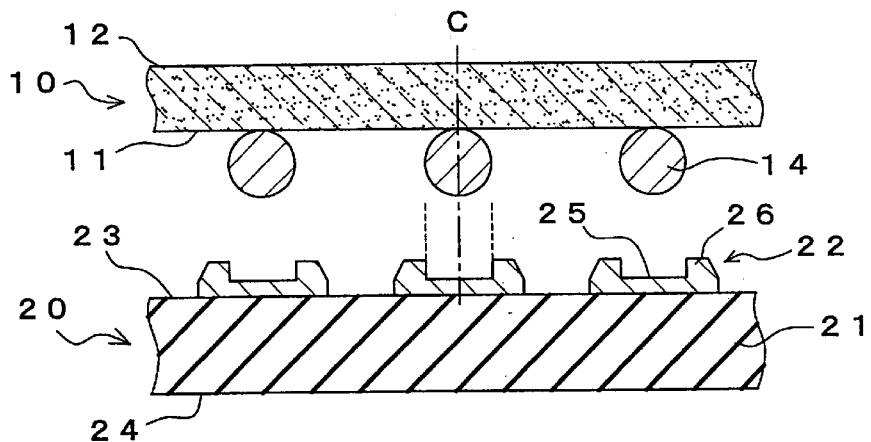
FIG. 1 is a partial enlarged cross sectional view of a printed wired board according to Embodiment 1 of the present invention and a semiconductor integrated circuit device to be mounted thereon.

Referring to FIGS. 1 and 2A through 2D, a printed wired board and a semiconductor integrated circuit device to be mounted thereon according to Embodiment 1 of the present invention will be described hereinafter. In the present specification, a semiconductor integrated circuit device may be referred to simply as "IC device" or "MMIC chip (Microwave Monolithic Integrated Circuit chip)". As shown in FIG. 1, the MMIC chip 10 has a substrate made of semiconductor material such as silicon (Si) and gallium arsenide (GaAs). The MMIC chip 10 is a flip-chip device having a downward faced chip surface (circuit surface) 11 and an upward faced chip surface (circuit flip-surface) 12. On the downward faced chip surface 11 are formed a plurality of solder bumps 14, each having a spherical configuration having a diameter of less than 100 microns, for example, 80 microns.

Meanwhile, the printed wired board 20 of Embodiment 1 includes, in general, a board 21 made of insulating material, a plurality of conductive wire patterns (not shown), and a plurality of conductive recessed members 22 at positions corresponding to each of the solder bumps 14 formed on the downward faced chip surface 11 of the MMIC chip 10. The insulating board 21 may be a built-up board made of material obtained by saturating glass fibers of base with epoxy resin or imide resin and then curing thereof. Also, the conductive wire patterns may be deposited on the board surface 23 of the insulating board 21 by chemical procedures such as plating and etching, or by screen-printing of conductive paste.

As illustrated in FIG. 1, each of the conductive recessed members 22 includes a bottom portion 25 formed by gold plating on the insulating board 21, and a wall portion 26 formed by gold plating at the periphery of the bottom portion 25. Also, each of the conductive recessed members 22 is electrically connected with the conductive wire pattern.

Figure 2A:
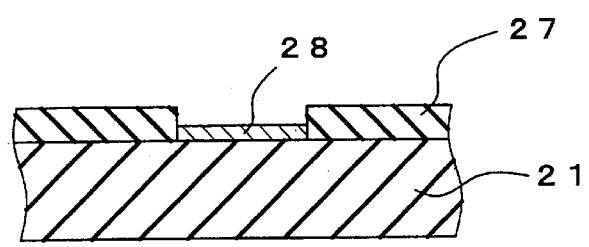
FIGS. 2A–2D are enlarged cross sectional views of a printed wired board according to Embodiment 1, illustrating a manufacturing process thereof.
Figure 2B:
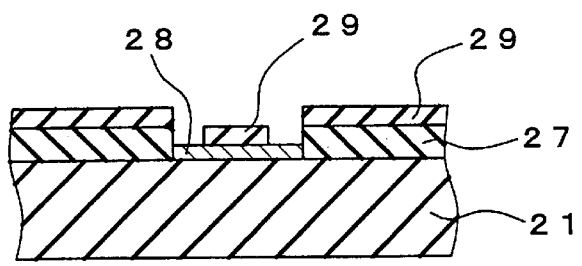
Figure 2C:
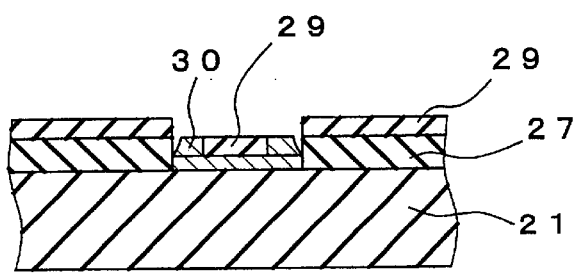
Figure 2D:
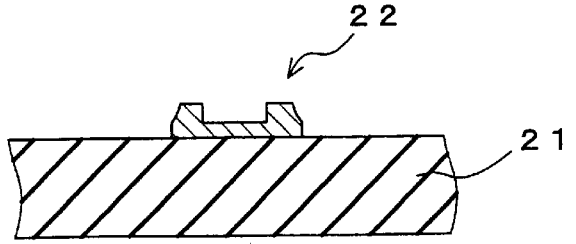

With reference of FIGS. 2A through 2D, the process for forming the conductive recessed member 22 will briefly be discussed. First, a mask 27 is formed on the board 21, remaining uncovered at circular regions where the conductive recessed member 22 is to be formed. Also, the board 21 is gold plated to form a gold layer 28 partially defining the bottom portion 25 (see FIG. 2A). An another mask 29 is added substantially on the middle of the gold layer 28 (see FIG. 2B), then another gold layer 30 defining the wall portion 26 is laminated on the gold layer 28 by gold plating (see FIG. 2C). Lastly, as shown in FIG. 2D, the masks 27, 29 are removed so as to obtain the conductive recessed member 22.

As illustrated in FIG. 1, the MMIC chip 10 is positioned over the printed wired board 20 so that the vertical centerline C of each solder bump 14 extends through the bottom portion 25 of the corresponding conductive recessed member 22. When the MMIC chip 10 is placed on the printed wired board 20, the wall portion 26 of each conductive recessed member 22 guides the corresponding solder bump 14 into the bottom portion 25 so that the solder bump 14 is received on the stable position within each conductive recessed member 22. Thus, according to the present embodiment, as long as the vertical centerline C of each solder bump 14 extends through the bottom portion 25 of the corresponding conductive recessed member 22, the conductive recessed member 22 self-aligns the solder bump 14, so as to eliminate the necessity of the precise alignment in flip-chip mounting. For example, in case where the bottom portion 25 and solder bump 14 have diameters of 80 microns, arrangement of the MMIC chip 10 over the printed wired board 20 with an alignment accuracy of ±40 microns causes each solder bump 14 to be aligned and received in the corresponding conductive recessed member 22, thereby achieving a good electrical connection between each solder bump 14 and corresponding conductive recessed member 22. To this end, even where the MMIC chip 10 and the printed wired board 20 are positioned with the alignment accuracy as the diameter of the solder bump, each conductive recessed member 22 can self-align the corresponding solder bump 14 in an exact and precise manner.

Modification 1.

With respect to the conductive recessed member 22 of Embodiment 1, a couple of Modifications will be described hereinafter. The conductive recessed member 22 of Modification 1 includes an etched portion 32 formed by etching the printed wired board 20, and a gold layer (conductive layer) 34 formed by gold plating on the etched portion 32, which is electrically connected to the conductive wire pattern (not shown).

Figure 4A:
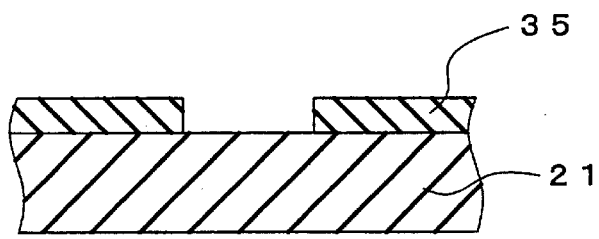
FIGS. 4A–4D are enlarged cross sectional views of a printed wired board according to Modification 1 of Embodiment 1, illustrating a manufacturing process thereof.
Figure 4B:
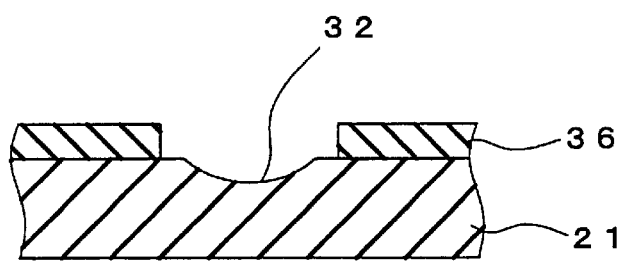
Figure 4C:
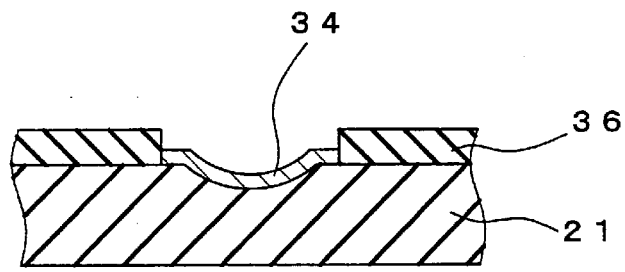
Figure 4D:
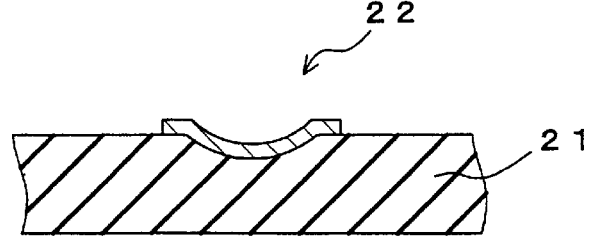

Next, with reference to FIGS. 4A through 4D, the manufacturing process of the modified conductive recessed member 22 will be described hereinafter. A mask 35 is formed on the board 21, remaining uncovered at circular regions where the conductive recessed member 22 is to be formed (see FIG. 4A). Also, the board 21 is etched to form the etched portion 32. Then, the mask is removed and another mask 36 is formed so as to surround the etched portion 32 (see FIG. 4B). A gold layer 34 is formed by gold plating on the etched portion 32 (see FIG. 4C). Preferably, the wire patterns are formed simultaneously with the gold layer 34. Lastly, the mask 36 is removed to obtain the conductive recessed member 22, as shown in FIG. 4D.

Figure 3:
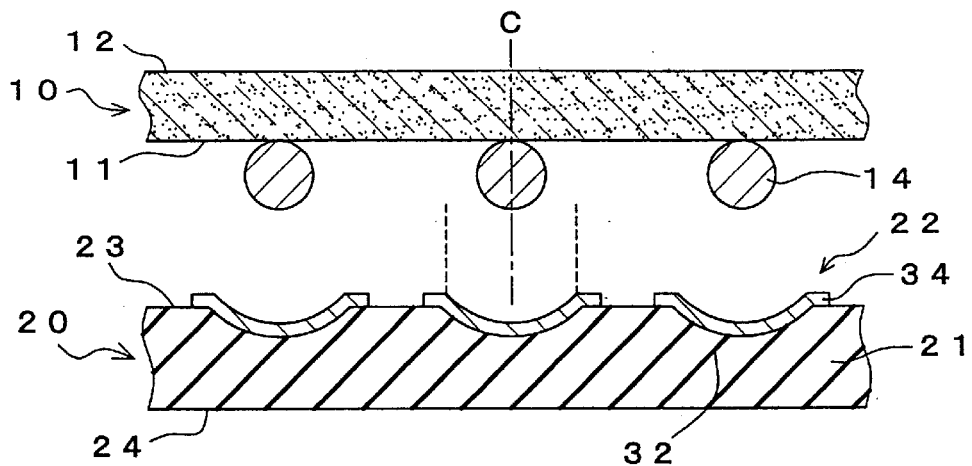
FIG. 3 is a partial enlarged cross sectional view of a printed wired board according to Modification 1 of Embodiment 1 and a semiconductor integrated circuit device to be mounted thereon.

The MMIC chip 10 is mounted on the printed wired board 20 so that the chip surface 11 and the board surface 23 oppose to each other. Similar to Embodiment 1 and as illustrated in FIG. 3, when the vertical centerline C of each solder bump 14 extends through the etched portion 32 of the corresponding conductive recessed member 22, the solder bump 14 is guided into the conductive recessed member 22 and received on the gold layer 34 in a stable manner. Therefore, the exact alignment accuracy in flip-chip mounting is not required.

When the solder bump 14 is received within the conductive recessed member 22 and heated during the reflow process, the conductive recessed member 22 serves the function as bearing against lateral stress between the solder bump 14 and the conductive recessed member 22. Therefore, the conductive recessed member 22 prevents the wire pattern, which are simultaneously formed on the board 21, from peeling off to open circuit. In other words, the conductive recessed member 22 can protect the wire patterns from the lateral stress.

Modification 2.

Figure 5:
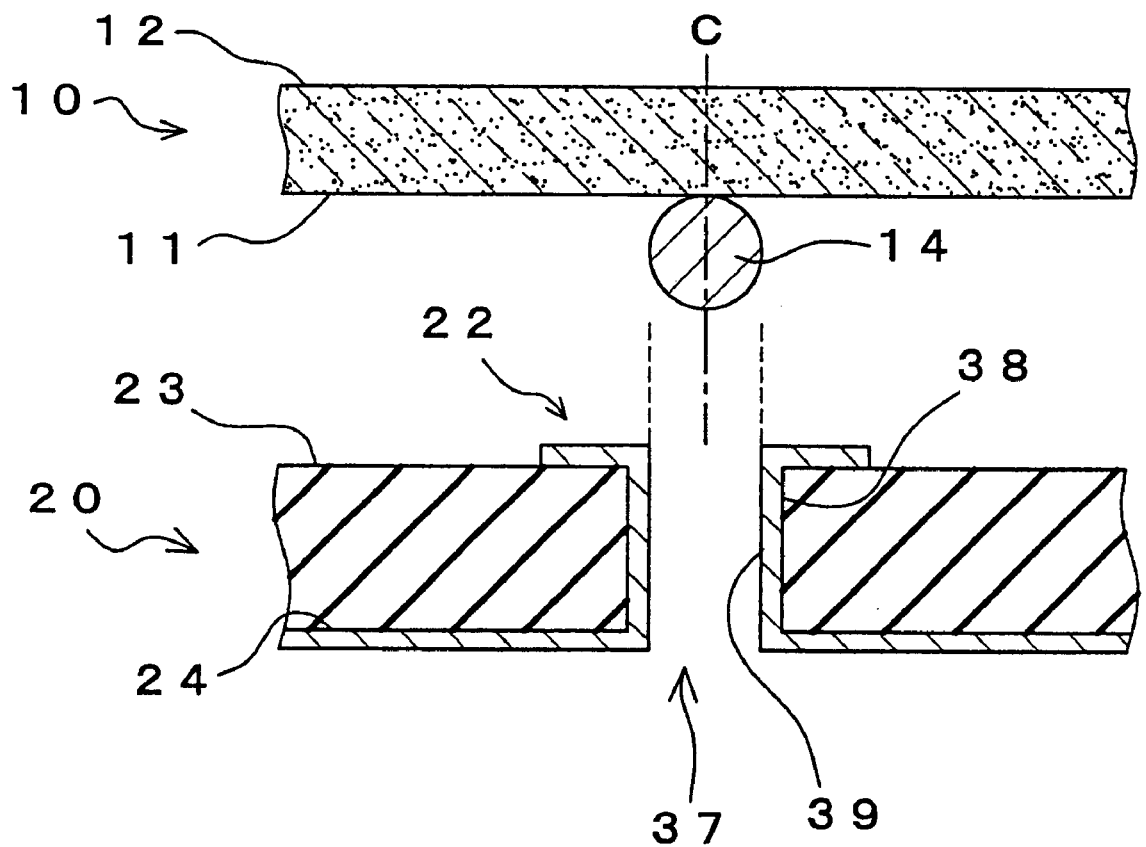
FIG. 5 is a partial enlarged cross sectional view of a printed wired board according to Modification 2 of Embodiment 1 and a semiconductor integrated circuit device to be mounted thereon.

As illustrated in FIG. 5, another conductive recessed member 22 of Modification 2 includes a gold layer (conductive layer) 39 formed on an inner wall 38 of a through-hole 37. The gold layer 39 is also electrically connected to the wire pattern (not shown).

The MMIC chip 10 is mounted on the printed wired board 20 so that the chip surface 11 and the board surface 23 oppose to each other. Similar to Embodiment 1 and as illustrated in FIG. 5, when the vertical centerline C of each solder bump 14 extends through the through-hole 37 of the corresponding conductive recessed member 22, the solder bump 14 is guided into the conductive recessed member 22 and received on the stable position of the through-hole 37. Therefore, the conductive recessed member 22 self-aligns the solder bump 14 so as to eliminate the necessity of the precise alignment in flip-chip mounting.

It should be noted that the conductive recessed member 22 of Modification 2 also serves the function as bearing against lateral stress between the solder bump 14 and the conductive recessed member 22 during the reflow process. Therefore, the conductive recessed member 22 also prevents the wire pattern simultaneously formed on the board 21 from peeling off to open circuit.

Embodiment 2.

Figure 6:
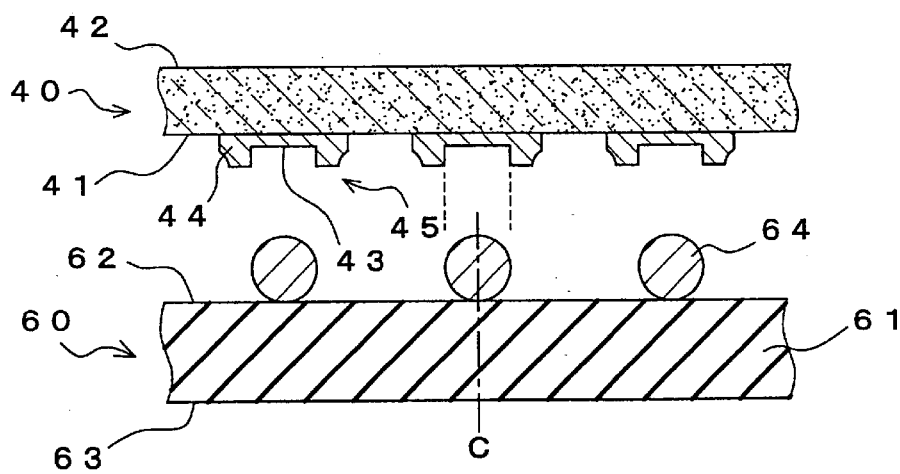
FIG. 6 is a partial enlarged cross sectional view of a printed wired board and a semiconductor integrated circuit device to be mounted thereon according to Embodiment 2 of the present invention.

Referring to FIGS. 6 and 7A through 7D, a semiconductor integrated circuit device and a printed wired board for mounting the device according to Embodiment 2 of the present invention will be described hereinafter. As shown in FIG. 6 and similar to Embodiment 1, the IC device 40 is a MMIC chip having a chip surface 41 and a chip flip-surface 42 facing downwardly and upwardly, respectively. On the downward faced chip surface 41 are formed a plurality of conductive recessed members 45 including a bottom portion 43 formed by gold plating on the MMIC chip 40, and a wall portion 44 formed by gold plating at the periphery of the bottom portion 43.

Figure 7A:
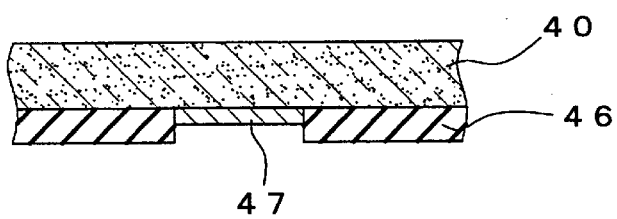
FIGS. 7A–7D are enlarged cross sectional views of a semiconductor integrated circuit e according to Embodiment 2, illustrating a manufacturing process thereof.
Figure 7B:
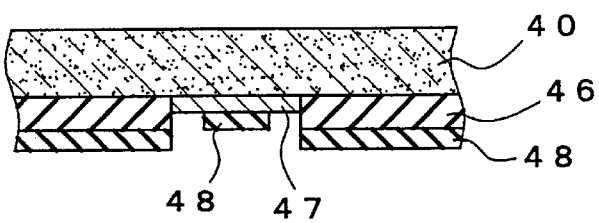
Figure 7C:
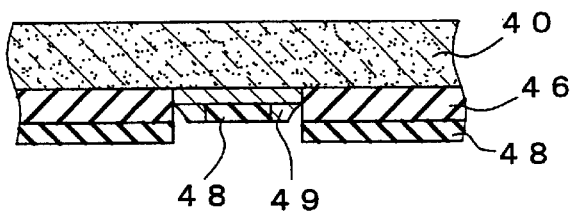
Figure 7D:
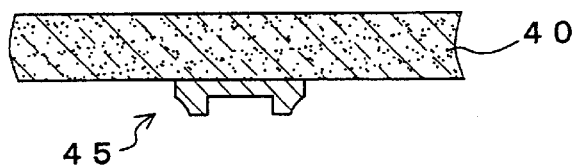

Next, with reference of FIGS. 7A through 7D, the process for forming the conductive recessed member 45 will briefly be discussed. First, a mask 46 is formed on the MMIC chip 40, remaining uncovered at circular regions where the conductive recessed member 45 is to be formed. And the MMIC chip 40 is gold plated to form a gold layer 47 partially defining the bottom portion 43 (see FIG. 7A). An another mask 48 is added substantially on the middle of the gold layer 47 (see FIG. 7B), then another gold layer 49 constituting the wall portion 44 is laminated on the gold layer 47 by gold plating (see FIG. 7C). Lastly, as shown in FIG. 7D, the masks 46, 48 are removed to obtain the conductive recessed member 45.

Meanwhile, the printed wired board 60 of Embodiment 2 includes, in general, a board 61 made of insulating material, and a plurality of conductive wire patterns (not shown). The insulating board 61 and the wire patterns are similar to those of Embodiment 1. The printed wired board 60 of Embodiment 2 further includes a plurality of solder bumps 64 formed at positions corresponding to each of the conductive recessed member 45. Each of the solder bumps 64 has spherical configuration having a diameter of less than 100 microns, for example, 80 microns.

The MMIC chip 40 is mounted on the printed wired board 60 so that the chip surface 41 and the board surface 62 oppose to each other. As illustrated in FIG. 6, the MMIC chip 40 is positioned over the printed wired board 60 so that the vertical centerline C of each solder bump 64 extends through the bottom portion 43 of the corresponding conductive recessed member 45. When the MMIC chip 40 is placed on the printed wired board 60, the wall portion 44 of each conductive recessed member 45 guides the corresponding solder bump 64 into the bottom portion 43 so that the solder bump 64 is received on the stable position within each conductive recessed member 45. In other words, according to the present embodiment, as long as the vertical centerline C of each solder bump 64 extends through the bottom portion 43 of the corresponding conductive recessed member 45, the conductive recessed member 45 self-aligns the solder bump 64, so as to eliminate the necessity of the precise alignment in flip-chip mounting.

Modification 3.

With respect to the conductive recessed member of Embodiment 2, a couple of Modifications will be described hereinafter. The conductive recessed member 45 of Modification 3 includes an etched portion 50 formed by dry-etching the MMIC chip 40, and a gold layer (conductive layer) 51 formed by gold plating on the etched portion 50, which is electrically connected to the conductive wire pattern (not shown).

Figure 9A:
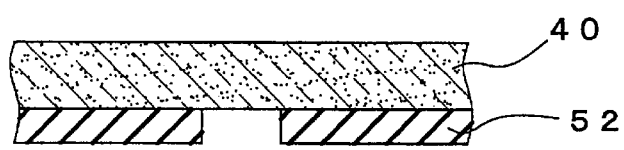
FIGS. 9A–9D are enlarged cross sectional views of a printed wired board and a semiconductor integrated circuit device to be mounted thereon according to Modification 3 of Embodiment 2, illustrating a manufacturing process thereof.
Figure 9B:
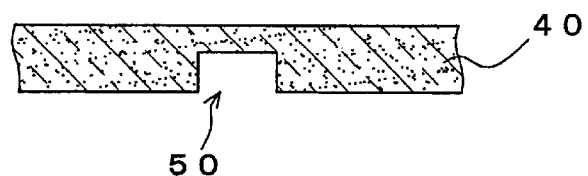
Figure 9C:
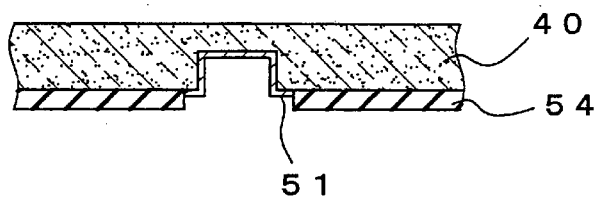
Figure 9D:
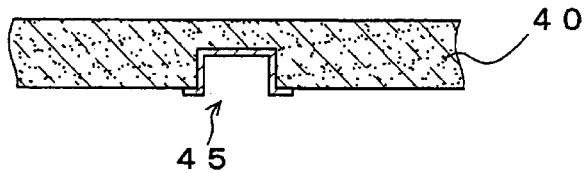

Next, with reference to FIGS. 9A through 9D, the manufacturing process of the conductive recessed member 45 will be described hereinafter. A mask 52 is formed on the MMIC chip 40, remaining uncovered at circular regions where the conductive recessed member 45 is to be formed (see FIG. 9A). Also, the MMIC chip 40 is dry-etched to form the etched portion 50. Then, the mask 52 is removed and another mask 54 is formed so as to surround the etched portion 50 (see FIG. 9B). A gold layer 51 constituting the conductive layer is formed by gold plating on the etched portion 50 (see FIG. 9C). And lastly, the masks 54 is removed to obtain the conductive recessed member 45, as shown in FIG. 9D. The conductive recessed member 45 has so-called SIV (Source Island Viahole) structure.

Figure 8:
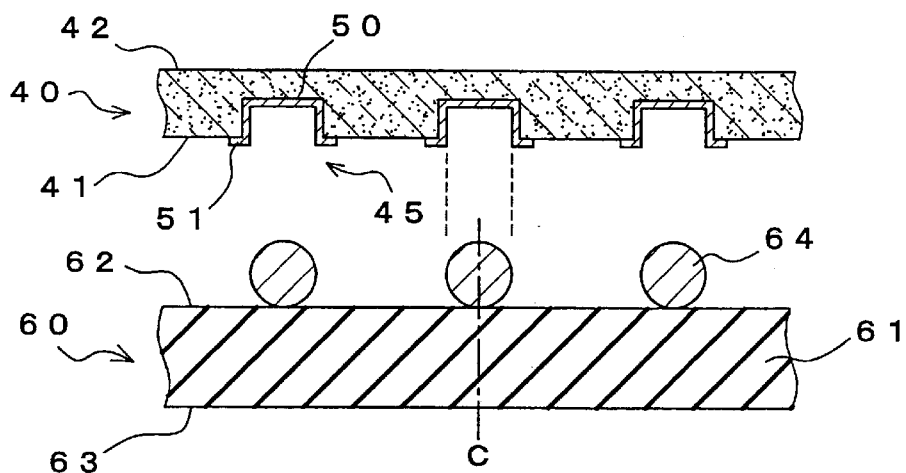
FIG. 8 is a partial enlarged cross sectional view of a printed wired board and a semiconductor integrated circuit device to be mounted thereon according to Modification 3 of Embodiment 2.

The MMIC chip 40 is mounted on the printed wired board 60 so that the chip surface 41 and the board surface 62 oppose to each other. Similar to Embodiment 2 and as illustrated in FIG. 8, when the vertical centerline C of each solder bump 64 extends through the etched portion 50 of the corresponding conductive recessed member 45, the solder bump 64 is guided into the conductive recessed member 45 and received on the stable position of the gold layer 51. Therefore, the conductive recessed member 45 self-aligns the solder bump 64, so as to eliminate the necessity of the precise alignment in flip-chip mounting.

Also, the conductive recessed member 45 of Modification 3, similar to that of Modification 1, serves the function as bearing against lateral stress between the solder bump 64 and the conductive recessed member 45 during the reflow process. Therefore, the conductive recessed member 45 avoids the wire pattern connected thereto to peel off the MMIC chip 40.

Modification 4.

Figure 10:
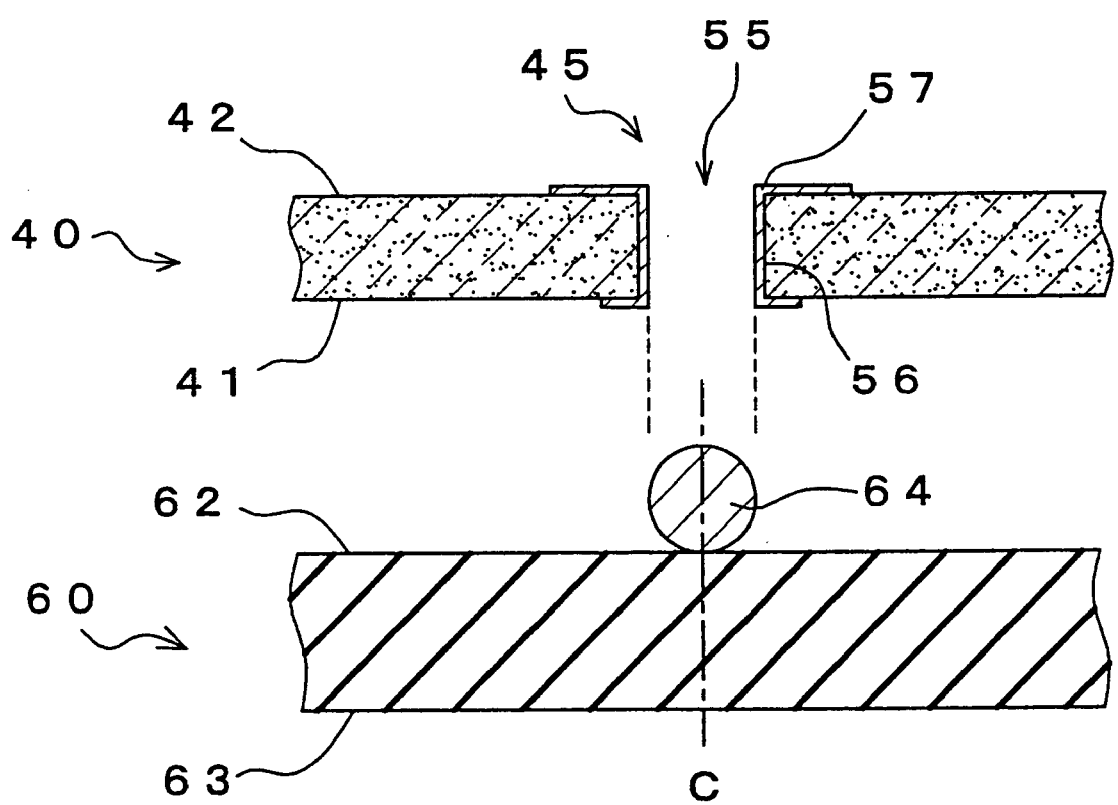
FIG. 10 is a partial enlarged cross sectional view of a printed wired board and a semiconductor integrated circuit device to be mounted thereon according to Modification 4 of Embodiment 2.

As illustrated in FIG. 10, an alternative conductive recessed member 45 of Modification 4 includes a gold layer (conductive layer) 57 formed on an inner wall 56 of a through-hole 55 formed by dry-etching. The gold layer 57 is electrically connected to the wire pattern (not shown).

The MMIC chip 40 so constructed is flip-chip mounted on the printed wired board 60. Similar to Embodiment 2 and as illustrated in FIG. 10, when the vertical centerline C of each solder bump 64 extends through the through-hole 55 of the corresponding conductive recessed member 45, the solder bump 64 is guided into the conductive recessed member 45 and received on the stable position of the through-hole 55. Therefore, the conductive recessed member 45 self-aligns the solder bump 64, so as to eliminate the necessity of the precise alignment in flip-chip mounting.

In addition, preferably, a plurality of biasing wire layers, each of which is connected to the gold layer 57 formed on the inner wall 56 of the through-hole 55, are formed on the chip flip-surface 42 of the MMIC 40 of Modification 4. To this end, the biasing wire patterns with large current capacity are realized without enlarging the package of the MMIC 40.

Embodiment 3.

Figure 11:
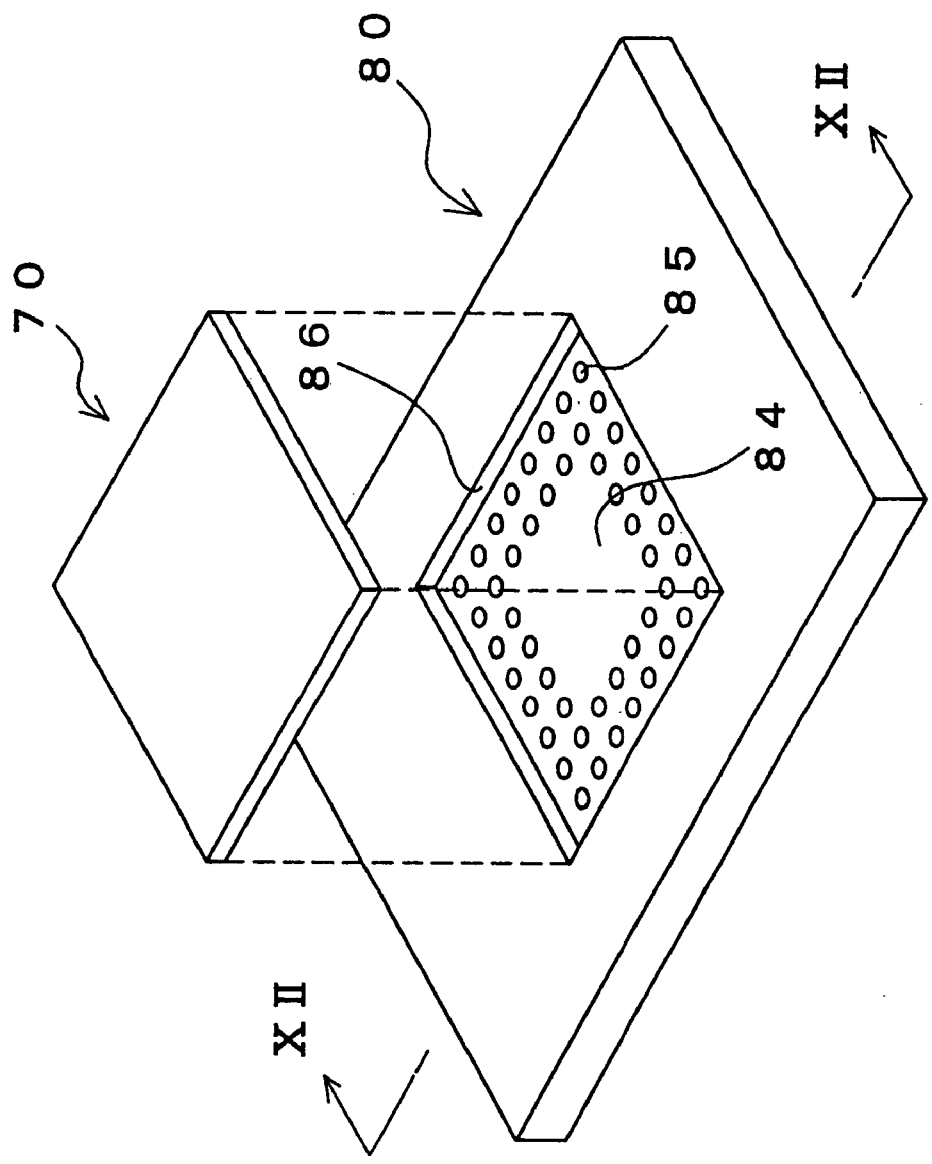
FIG. 11 is a perspective view of a printed wired board according to Embodiment 3 of the present invention and a semiconductor integrated circuit device to be mounted thereon.
Figure 12:
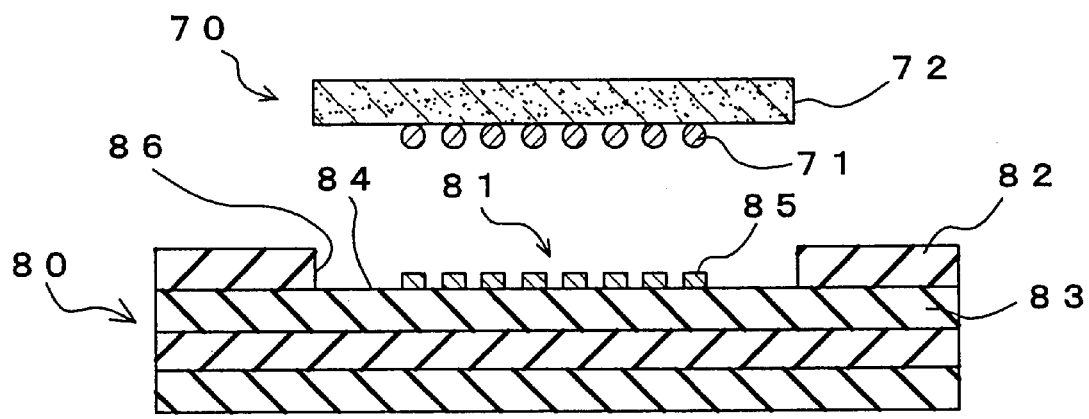
FIG. 12 is a cross sectional view of a printed wired board according to Embodiment 3 and a semiconductor integrated circuit device to be mounted thereon.
Figure 13:
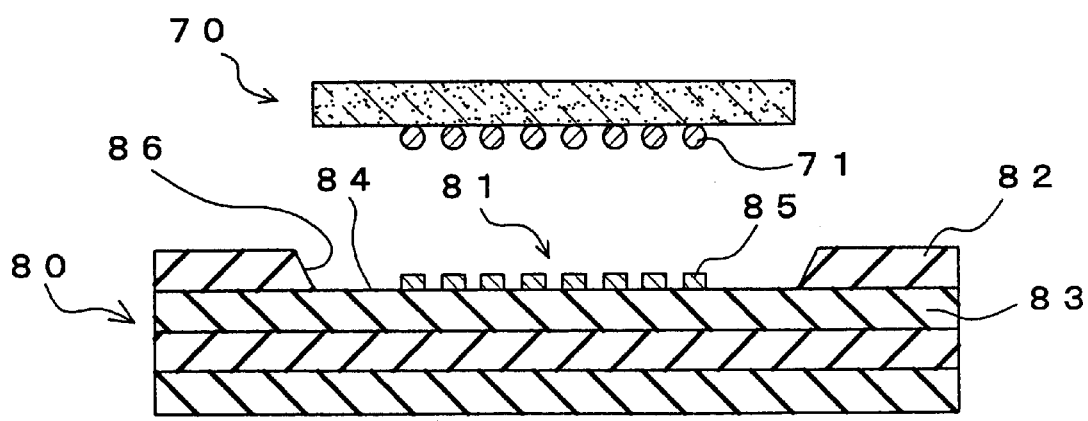
FIG. 13 is a cross sectional view of a printed wired board according to Modification of Embodiment 3 and a semiconductor integrated circuit device to be mounted thereon.

Referring to FIGS. 11 through 13, a printed wired board according to Embodiment 3 of the present invention will be described hereinafter. Since the structure of a semiconductor integrated circuit device to be mounted on the printed wired board is similar to the conventional one, no further description thereof will be presented herein. Also, the printed wired board of Embodiment 3 has common features as a conventional one, thus, description thereof will be provided focusing on the defining features of Embodiment 3.

As illustrated in FIGS. 11 and 12, the printed wired board 80 of Embodiment 3 includes a receiving depression 81 of a predetermined planar configuration that is substantially the same as that of the MMIC chip 70. The printed wired board 80 is a built-up board including a plurality of sub-boards, e.g., four sub-boards. The receiving depression 81 may be formed by boring a middle portion out of the uppermost sub-board 82 so as to make a void of the predetermined planar configuration, and by attaching the resultant uppermost sub-board 82 with the remaining sub-boards 83. Thus, the receiving depression 81 is defined by a bottom surface 84 and a peripheral wall surface 86. Alternatively, the receiving depression 81 may be formed in any other processes that can be conceived by those skilled in the art. On the bottom surface 84 of the receiving depression 81 are formed a plurality of substrate electrodes 85.

Since the uppermost sub-board 82 is attached on the remaining sub-boards 83 in a precise manner, the peripheral wall surface 86 can also precisely be positioned relative to the substrate electrodes 85. Therefore, when the MMIC chip 70 is mounted on the printed wired board 80, the peripheral wall surface 86 can be used as an alignment restraint to guide the MMIC chip 70 along the peripheral wall surface 86 into the receiving depression 81. Thus, the MMIC chip 70 is aligned with the printed wired board 80 with the precise alignment accuracy.

Preferably, as shown in FIG. 13, the peripheral wall surface 86 is inclined opening upwardly for facilitating the MMIC chip 70 to be inserted into the receiving depression 81. Thus, the MMIC chip 70 can easily be fit within the receiving depression 81, so that each of the conductive bumps 71 is aligned to the corresponding substrate electrode 85 in a precise manner.

More preferably, an insulating film (not shown) is formed either on the peripheral surface 86 or on a peripheral portion 72 of the MMIC chip 70 so as to prevent an electric current from leaking between the peripheral surface 86 and the MMIC chip 70.

Embodiment 4.

Figure 14:
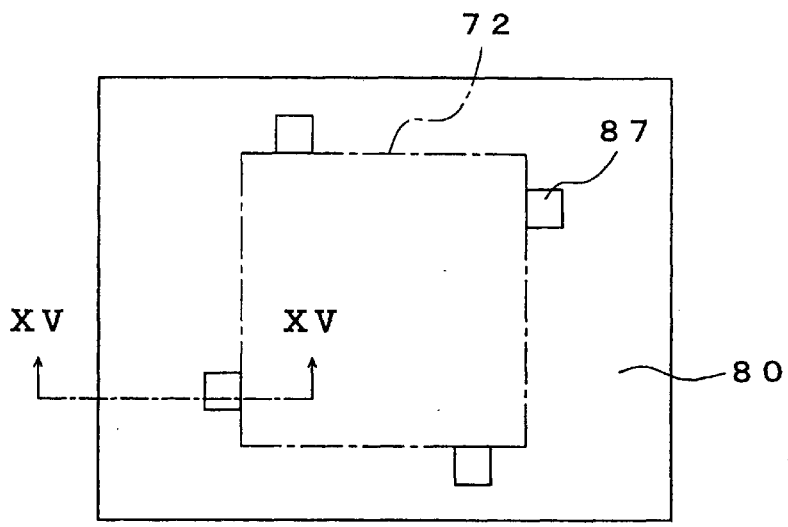
FIG. 14 is a top view of a printed wired board according to Embodiment 4 of the present invention.
Figure 15:
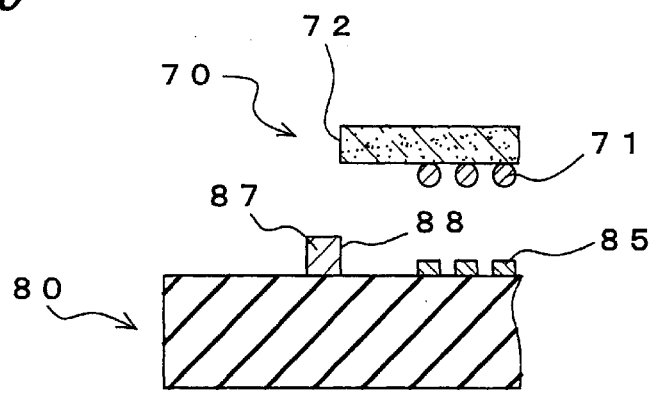
FIG. 15 is a partial cross sectional view of a printed wired board according to Embodiment 4 and a semiconductor integrated circuit device to be mounted thereon.
Figure 16:
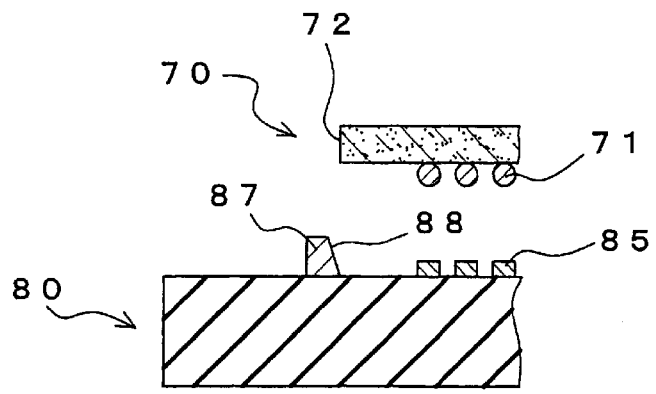
FIG. 16 is a partial cross sectional view of a printed wired board according to Modification of Embodiment 4 and a semiconductor integrated circuit device to be mounted thereon.

Referring to FIGS. 14 through 16, a printed wired board according to Embodiment 4 of the present invention will be described hereinafter. Since the structure of a semiconductor integrated circuit device to be mounted on the printed wired board is similar to well known one, no further description thereof will be presented herein. Also, the printed wired board of Embodiment 4 has common features as a conventional one, thus, description thereof will be provided focusing on the distinguishable features of Embodiment 4.

As illustrated in FIG. 14, the printed wired board 80 of Embodiment 4 includes four bosses 87 formed by plating with use of hard metal such as copper and steel. The bosses 87 made of hard metal-cannot easily be deformed in comparison with those made of soft metal such as gold and solder. Also, each boss 87 has rectangular configuration, and a contacting surface 88 thereof contacts the peripheral portion 72 of the MMIC chip 70 as indicated by the imaginary line 72 shown in FIG. 14. Thus, the contacting surfaces 88 of the hard bosses 87 can be used as alignment restraints to guide the MMIC chip 70 along the contacting surfaces 88 onto the printed wired board 80. As the result, each of the solder bumps 71 is aligned to the corresponding board electrode 85 in a precise manner.

Although four bosses 87 are used in the above description, at least three out-of-line bosses 87 are required to guide the MMIC chip 70 as alignment restraints in two different directions. For example, four bosses 87 may be formed on the printed wired board 80 so as to surround the MMIC chip 70 as shown in FIG. 14. Preferably, each contacting surfaces 88 of the boss 87 is inclined opening upwardly as shown in FIG. 16 for facilitating the MMIC chip 70 to be positioned onto the printed wired board 80. Thus, the MMIC chip 70 can easily be fit inside the bosses 87, so that each of the solder bumps 71 is aligned to the corresponding board electrode 85 in an precise manner.

More preferably, an insulating film (not shown) is formed either on the contacting surfaces 88 of the bosses 87 or on the peripheral portion 72 of the MMIC chip 70 so as to prevent an electric current from leaking between the bosses 87 and the MMIC chip 70.

Embodiment 5.

Figure 17:
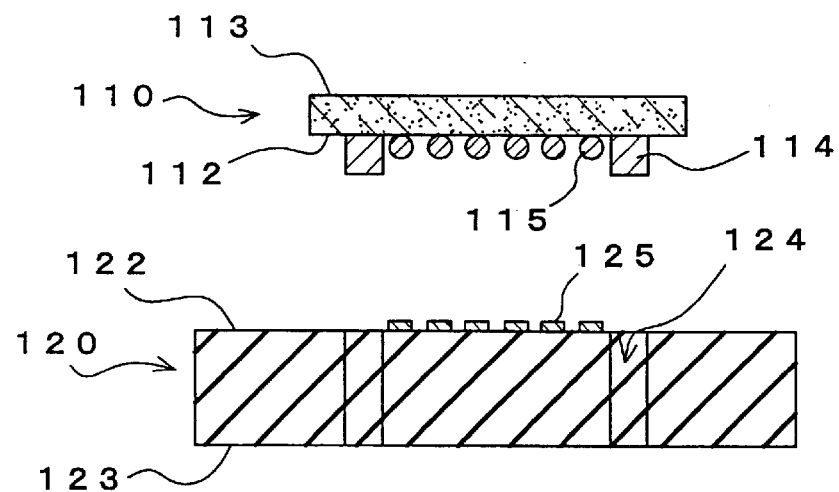
FIG. 17 is a cross sectional view of a printed wired board and a semiconductor integrated circuit device to be mounted thereon according to Embodiment 5 of the present invention.
Figure 18:
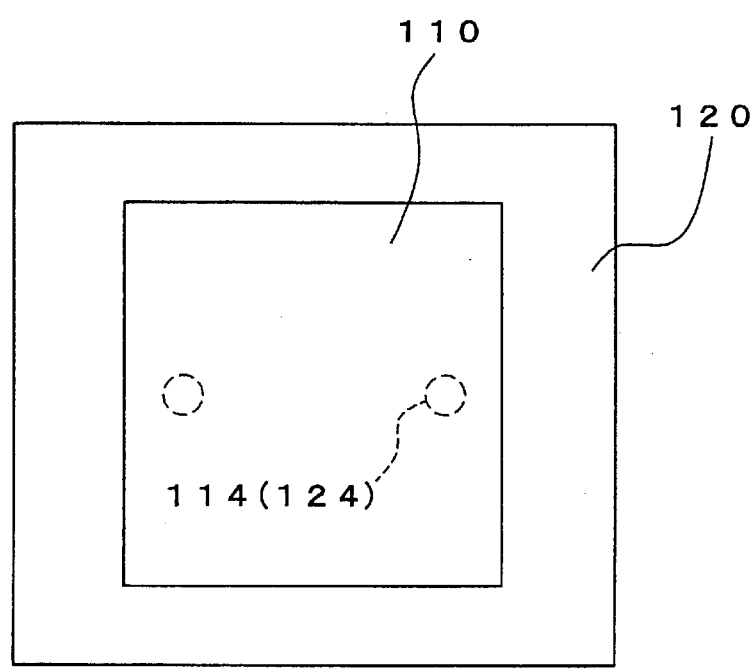
FIG. 18 is a top view of a printed wired board according to Embodiment 5.

Referring to FIGS. 17 and 18, a semiconductor integrated circuit device and a printed wired board according to Embodiment 5 of the present invention will be described hereinafter. The IC device and the printed wired board of Embodiment 5 have a plurality of bosses made of hard metal such as copper and steel and through-holes for receiving the bosses, respectively, and the other structures thereof are similar to those of conventional ones. Thus, no duplicate description will be made herein.

As above, the MMIC chip 110 of Embodiment 5 includes, on the chip surface 112, a plurality of bosses 114 (only two shown in FIG. 17) formed by plating with use of hard metal such as copper and steel and a plurality of solder bumps 115. The boss 114 made of hard metal is not likely to be deformed in comparison with that made of soft metal such as gold and solder. Each boss 114 is designed to have a height (H) greater than the diameter (R) of each solder bump 115 (H>R). Meanwhile, the printed wired board 120 of Embodiment 5 have a plurality of through-holes 124 on the board surface 122 at positions corresponding to those of the bosses 114.

When the MMIC chip 110 is mounted on the printed wired board 120, each of the through-holes 124 of the printed wired board 120 receives the corresponding boss 114 of the MMIC chip 110. The hard bosses 124 serve as alignment restraints without deformation so as to align each of the solder bumps 115 to the corresponding substrate electrode 125 in a precise manner.

Instead of the through-holes 124, a plurality of recesses formed by any suitable manner may be used as alignment restraints so as to receive the bosses 114. However, when such a recess having a predetermined depth (d) receives the boss 114, and if the difference between the height (H) of the boss 114 and the predetermined depth (d) of the recess (H−d) is greater than the diameter (R) of the solder bump 115

(H−d>R), then the solder bump 115 cannot reach the board electrode 125. Therefore, the diameter (R) of the solder bump 115 should be greater than the difference between the height (H) of the boss 114 and the predetermined depth (d) of the recess (H−d). Thus, the height (H) of the boss 114, the predetermined depth (d) of the recess, and the diameter (R) of the solder bump 115 have to satisfy the following condition;

$$(R+d)>H>R$$

Preferably, both of the planar configurations of the bosses 114 and the through-holes (recesses) 124 are circular as shown in FIG. 18, so that the bosses 114 can easily be inserted and fit into the through-holes (recesses) 124.

Furthermore, it is advantageous that an insulating film (not shown) is formed either on contacting surface of the boss 114 or an inside wall of the through-hole (recess) 124 so as to prevent an electric current from leaking between the boss 114 and the MMIC chip 120.

Embodiment 6.

Figure 19:
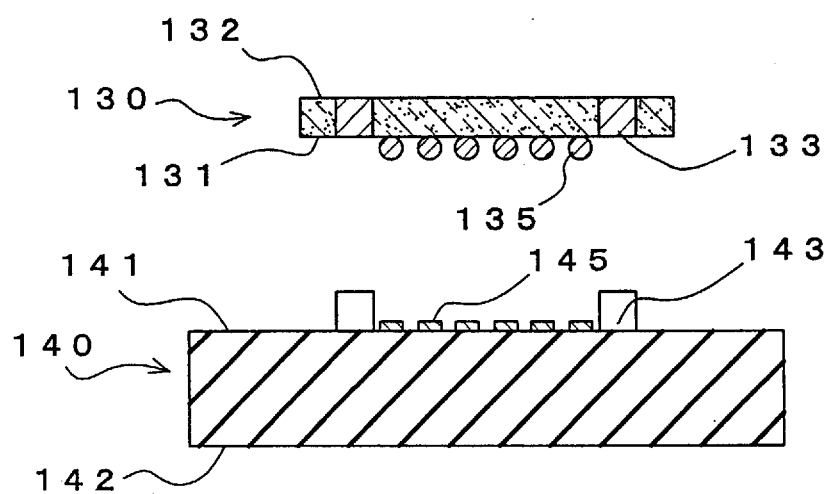
FIG. 19 is a cross sectional view of a printed wired board and a semiconductor integrated circuit device to be mounted thereon according to Embodiment 6 of the present invention.
Figure 20:
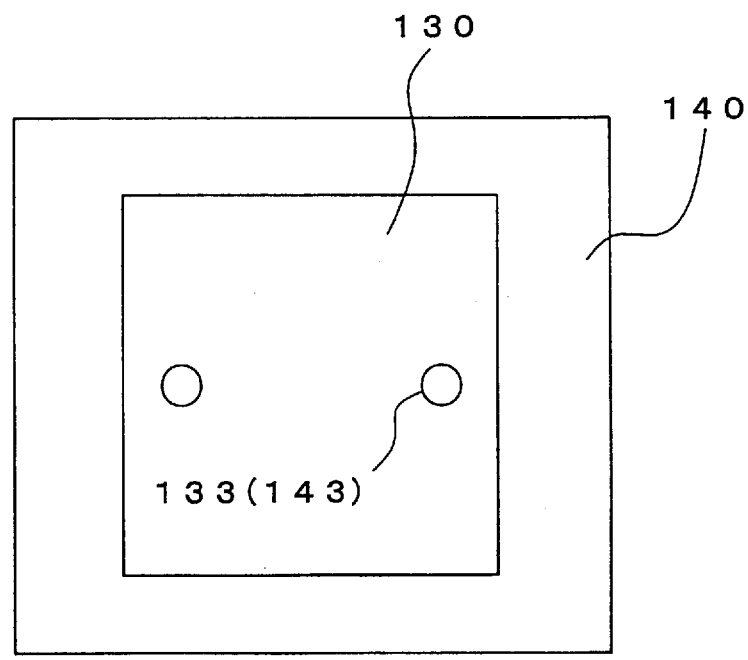
FIG. 20 is a top view of a printed wired board according to Embodiment 6.
Figure 22A:
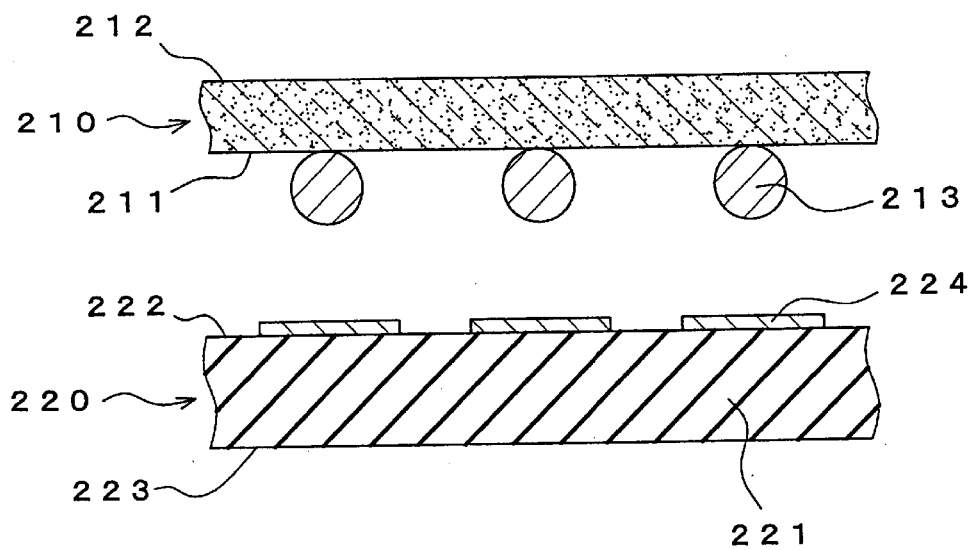
FIGS. 22A and 22B are cross sectional views of a printed wired board and a semiconductor integrated circuit device to be mounted thereon according to the prior art.
Figure 22B:
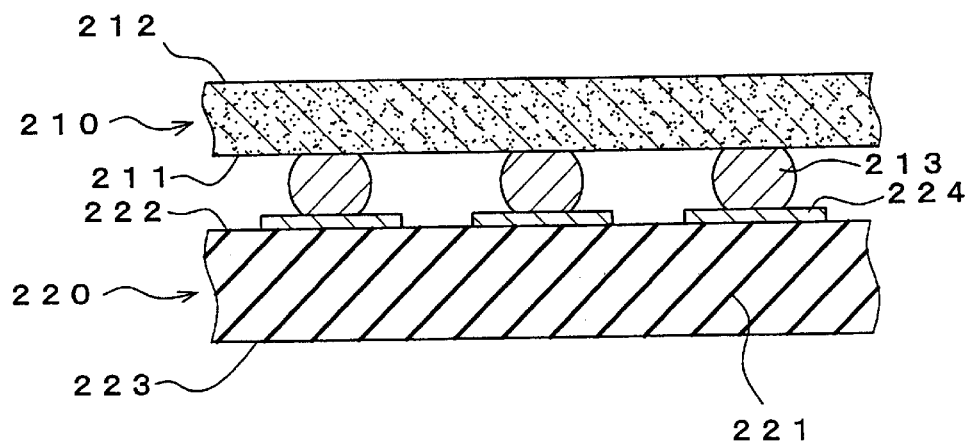

Referring to FIGS. 19 and 20, a semiconductor integrated circuit device and a printed wired board according to Embodiment 6 of the present invention will be described hereinafter. The semiconductor integrated circuit device and the printed wired board of Embodiment 6 have a plurality of through-holes and bosses made of hard metal to be fit into the through-holes, respectively, and the other structures thereof are similar to those of conventional ones, which will not further be described herein.

As illustrated in FIG. 19, the MMIC chip 130 of Embodiment 6 includes a plurality of through-holes 133 formed by dry-etching the chip surface 131. On the other hand, the printed wired board 120 of Embodiment 6 has a plurality of bosses 143 formed on the board surface 141 at positions corresponding to the through-holes 133 by plating with use of hard metal such as copper and steel. Such bosses 143 made of hard metal cannot easily be deformed in comparison with those of soft metal such as gold and solder. Each boss 143 is designed to have a height (H) greater than the diameter (R) of each solder bump 145 (H>R).

When the MMIC chip 130 is flip-chip mounted on the printed wired board 140, the through-holes 133 of the MMIC chip 130 receives the bosses 143 of the printed wired board 140. The hard bosses 143 serve as alignment restraints without deformation so as to align each of the solder bumps 135 to the corresponding substrate electrode 145 in a precise manner.

Instead of through-holes 133, a plurality of recesses formed by any suitable manner may be used as alignment restraints to receive the bosses 143. However, when such a recess having a predetermined depth (d) receives the boss 143, similar to Embodiment 5, the diameter (R) of the solder bump 135 should be greater than the difference between the height (H) of the boss 143 and the predetermined depth (d) of the recess (H−d). Thus, the height (H) of the boss 143, the predetermined depth (d) of the recess, and the diameter (R) of the solder bump 135 are required to satisfy the following condition;

$$(R+d)>H>R$$

Preferably, both of the planar configurations of the bosses 143 and the through-holes (recesses) 133 are circular as shown in FIG. 20, so that the bosses 143 can easily be inserted and fit into the through-holes (recesses) 133.

Furthermore, it is advantageous that an insulating film (not shown) is formed either on contacting surface of the boss 143 or an inside wall of the through-hole (recess) 130 so as to prevent an electric current from leaking between the boss 143 and the MMIC chip 130.

What is claimed is:

1. A semiconductor integrated circuit device for mounting on a wired printed circuit board, the wired printed circuit board having a plurality of conductive bumps, the semiconductor integrated circuit device comprising a semiconductor substrate having a plurality of electrically conductive members having respective recesses and located at positions of the semiconductor substrate corresponding to positions of the conductive bumps, for receiving the conductive bumps so that the semiconductor integrated circuit device may be aligned on the wired printed circuit board.

2. The semiconductor integrated circuit device according to claim 1, wherein each of the conductive members a plated metal member on the semiconductor substrate, having an internal bottom surface and a wall portion upstanding from and surrounding the bottom surface.

3. The semiconductor integrated circuit device according to claim 1, wherein each of the conductive members includes a recess in the semiconductor substrate and a conductive layer on the semiconductor substrate in the recess.

4. The semiconductor integrated circuit device according to claim 1, wherein each of the conductive members includes, as a recess, a through-hole passing through the semiconductor substrate and a conductive layer plated on an inner wall of the through-hole.

5. The semiconductor integrated circuit device according to claim 1, wherein the semiconductor substrate includes a circuit surface and a circuit flip-surface, the circuit flip-surface facing the wired printed circuit board when the semiconductor integrated circuit device is mounted on the wired printed circuit board, and including a wiring pattern on the circuit flip-surface, the wiring pattern electrically contacting one of the conductive bumps when the semiconductor integrated circuit device is mounted on the wired printed circuit board.

6. A wired printed circuit board for mounting a semiconductor integrated circuit device having a planar configuration and a plurality of conductive bumps, the wired printed circuit board comprising:

plurality of laminated sub-boards including a top sub-board and a first sub-board adjacent to the top sub-board, the top sub-board including an opening defined by sidewalls of the top sub-board, the opening exposing part of the first sub-board, the opening having a planar configuration substantially identical to the planar configuration of the semiconductor integrated circuit device for receiving the semiconductor integrated circuit device; and a plurality of substrate electrodes on the first sub-board exposed by the opening, wherein, when the semiconductor integrated circuit device is received in the opening, each of the conductive bumps is aligned with a corresponding substrate electrode.

7. The wired printed circuit board according to claim 6, wherein the sidewalls defining the opening are inclined relative to the first sub-board for guiding the semiconductor integrated circuit device into the opening so that the conductive bumps are aligned with the corresponding substrate electrodes.

8. A wired printed circuit board for mounting a semiconductor integrated circuit device having a plurality of conductive bumps, the wired printed circuit board comprising:

a plurality of board electrodes; and a plurality of metal bosses, each metal boss having a side surface, wherein when the semiconductor integrated circuit device is placed on the wired printed circuit board, the side surfaces of the plurality of metal bosses contact peripheral portions of the semiconductor integrated circuit device so the conductive bumps are aligned with corresponding board electrodes.

9. The wired printed circuit board according to claim 8 wherein each of the side surfaces of the metal bosses is inclined relative to the wired printed circuit board for guiding the semiconductor integrated circuit device relative to the wired printed circuit board so that the conductive bumps are aligned with the corresponding bosses.

10. The wired printed circuit board according to claim 8 wherein the metal bosses are a hard metal selected from the group consisting of steel and copper.

* * * * *